United States Patent [19]
Young et al.

[11] Patent Number: 5,206,821
[45] Date of Patent: Apr. 27, 1993

[54] DECIMATION CIRCUIT EMPLOYING MULTIPLE MEMORY DATA SHIFTING SECTION AND MULTIPLE ARITHMETIC LOGIC UNIT SECTION

[75] Inventors: William R. Young; William F. Johnstone, both of Palm Bay, Fla.

[73] Assignee: Harris Corporation, Melbourne, Fla.

[21] Appl. No.: 724,206

[22] Filed: Jul. 1, 1991

[51] Int. Cl.$^5$ ............................................. G06F 15/31
[52] U.S. Cl. .................................................. 364/724.1
[58] Field of Search ........... 364/724.1, 724.17, 724.01, 364/728.01

[56] References Cited

U.S. PATENT DOCUMENTS

| | | | |
|---|---|---|---|
| 4,489,393 | 12/1984 | Kawahara et al. | 364/728.01 |
| 4,972,356 | 11/1990 | Williams | 364/724.1 |
| 5,126,961 | 6/1992 | Garverick | 364/724.1 |
| 5,148,384 | 9/1992 | Ikegaya et al. | 364/728.01 |

*Primary Examiner*—Tan V. Mai
*Attorney, Agent, or Firm*—Evenson, Wands, Edwards, Lenahan & McKeown

[57] ABSTRACT

A decimating memory includes a memory having addressable memory locations. The memory forms a plurality of registers, each of the registers including at least one addressable memory location. The plurality of registers form a forward shifting data section and a reverse shifting data section. A first decoder operates the registers in the forward shifting data section and all but a first of the registers in the reverse shifting data section as first in first out registers via read and write addressing of the addressable memory locations to input and output data samples. The read and write addressing of the addressable memory locations is offset with respect to one another to provide a decimation factor. A paintbrush decoder operates the first register in the reverse shifting data section as a last in first out register for reverse sequencing data samples within blocks of data samples received from the forward shifting data section. Each of the registers in the forward shifting and reverse shifting data sections provide an output. An arithmetic logic unit section operates on the outputs and provides a decimating memory output.

33 Claims, 14 Drawing Sheets

EVEN SYMMETRY, EVEN NUMBER OF TAPS
DECIMATE BY ONE

EVEN SYMMETRY, ODD NUMBER OF TAPS
DECIMATE BY ONE

EVEN SYMMETRY, ODD NUMBER OF TAPS
DECIMATE BY TWO

EVEN SYMMETRY, ODD NUMBER OF TAPS
DECIMATE BY THREE

EVEN SYMMETRY, ODD NUMBER OF TAPS
DECIMATE BY THREE

DECIMATION CIRCUIT EMPLOYING MULTIPLE MEMORY DATA SHIFTING SECTION AND MULTIPLE ARITHMETIC LOGIC UNIT SECTION

FIELD OF THE INVENTION

The present invention relates to a decimating memory and, more particularly, to a decimating memory architecture providing increased filter performance.

BACKGROUND OF THE INVENTION

Decimating memories typically include a series of decimation registers, e.g. delay stages, having outputs coupled to arithmetic logic units (ALUs). These registers shift input data from register to register in an in-line or series fashion. Calculations are performed on the various register outputs provided to the arithmetic logic units. Decimating memories are useful in many applications such as for digital filter products wherein the output data rate is slower than the input data rate. In such a filter product, decimation can be used to implement a longer filter with only a limited amount of architectural hardware being necessary.

Conventionally, decimation memories are implemented using a series of shift registers which propagate the input data stream through the registers. However, this implementation requires that every piece of data in each individual shift register be moved when the data is propagated through the series of shift registers. This has the disadvantage of requiring a tremendous amount of power to operate the decimating memory. Further, prior known decimating memories utilize a large number of lines from the memory to implement the filter product. These lines take up space that could otherwise be useful for other circuit components.

There is therefore needed a decimating memory which overcomes the disadvantages of the prior art and performs decimation functions in an economical manner.

SUMMARY OF THE INVENTION

The present invention overcomes the disadvantages of the prior art by providing a decimating memory including a memory having addressable memory locations. The memory forms a plurality of registers, each of the registers including at least one addressable memory location. The plurality of registers form a forward shifting data section and a reverse shifting data section. A first decoder operates the registers in the forward shifting data section and all but a first of the registers in the reverse shifting data section as FIFO registers via read and write addressing of the addressable memory locations to input and output data samples. The read and write addressing of the addressable memory locations is offset with respect to one another to provide a decimation factor.

A paintbrush decoder operates the first register in the reverse shifting data section as a LIFO register for reverse sequencing data samples within blocks of data samples received from the forward shifting data section. Each of the registers in the forward shifting and reverse shifting data sections provide an output. An ALU section operates on the outputs and provides a decimating memory output.

The decimating memory architecture according to the present invention can be used to implement digital filters such as described in co-pending application Ser. No. 07/774,628, filed on Oct. 10, 1991, by David H. Damerow and William F. Johnstone, and entitled "Fold and Decimate Filter Architecture," commonly assigned to the Assignee of the present invention.

It is an advantageously preferred embodiment of the invention that the decimation memory be composed of a random access memory (RAM) having sequential read and write address lines for the memory elements, i.e. the decimation registers. The use of a multiplexed memory interconnect bus allows a filter to eliminate delay functions normally required for proper alignment of the data samples in symmetric filters having an odd number of taps. Further, the RAM memory reduces the necessary logic to implement a variable length decimation register by operating the memory as a LIFO or FIFO structure as required. The RAM memory includes read and write pointers controlled via decoders to operate the memory to function as the LIFO and FIFO registers. All FIFO registers are driven with the same address sequence while the LIFO locations are driven with a different address sequence.

It is a further advantage of the present invention that the arithmetic logic unit remains connected to the same memory sections in the decimating memory and that data is moved between the memory sections to align the data at the ALU inputs.

The present invention further provides a dual decimating memory configuration incorporating bus switching to allow for separate or cascaded operation of each decimating memory stage.

Other objects, advantages and novel features of the present invention will become apparent from the following detailed description of the invention when considered in conjunction with the accompanying drawings.

DETAILED DESCRIPTION OF THE DRAWINGS

Figure 1:
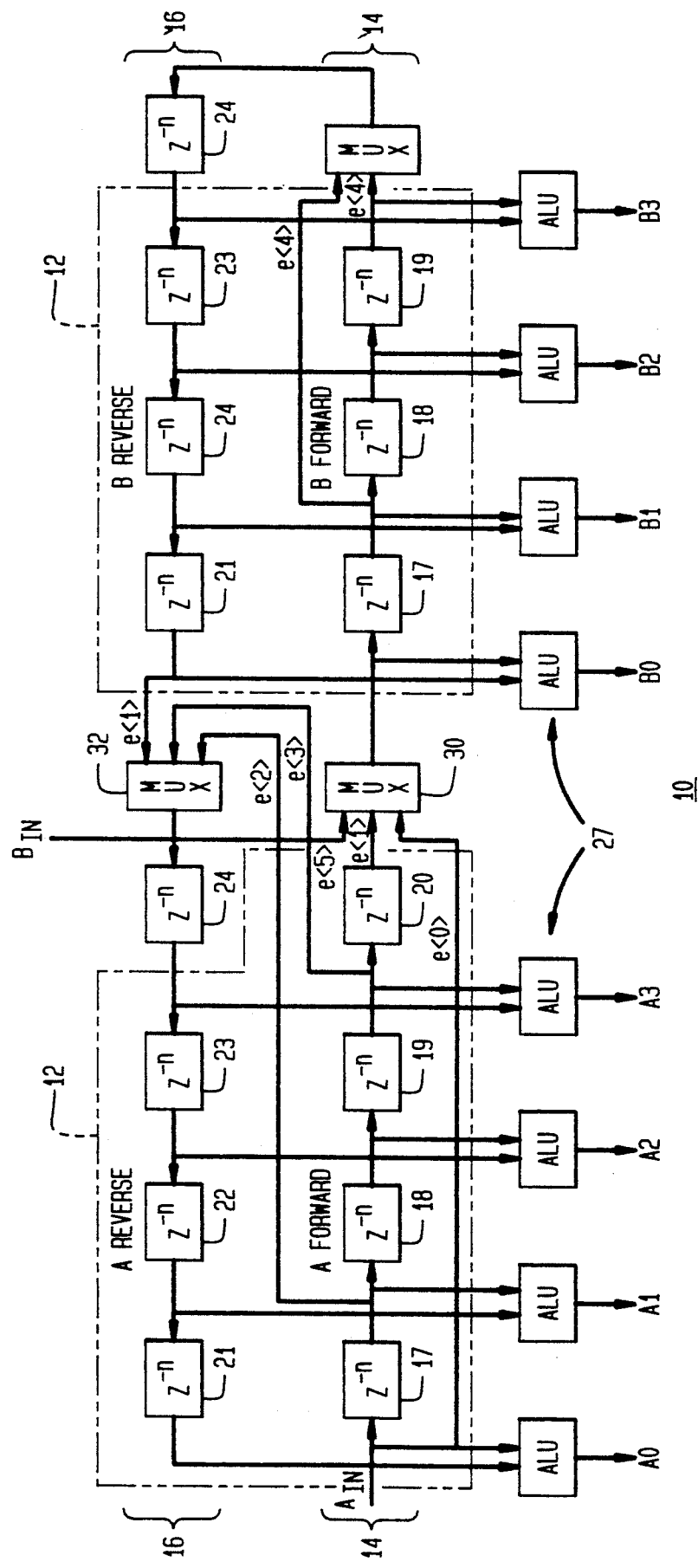
FIG. 1 is a simplified schematic block diagram of an embodiment of the decimating memory architecture of the present invention.

Referring to FIG. 1, a schematic block diagram of a decimating memory architecture 10 is shown. The FIG. 1 architecture is an example of a dual configuration including two stages A and B. It should be understood that while a dual configuration is shown, either stage alone may operate as a decimating memory in accordance with the present invention. Both the A and B stages include a decimation register section 12 containing a plurality of decimation registers or memory elements. Each decimation stage A and B includes a forward shifting section 14 and a reverse shifting section 16. For stage A, the forward shifting section 14 includes memory elements 17-20 coupled in series. An input data stream $A_{in}$, is provided to an input of memory element 17. The output of memory element 17 is coupled to the input of memory element 18 and so on through memory element 20. The input of each of memory elements 17-20 is also provided to an individual arithmetic logic unit (ALU), designated generally as 27. These arithmetic logic units 27 provide outputs A0-A3.

The reverse shifting section 16 of stage A includes memory elements 21-23 of the decimation register section 12 along with memory element 24. These memory elements 21-24 are likewise coupled in series. The outputs of memory elements 21-24 are also provided to the arithmetic logic units 27.

Two multiplexers 30 and 32 are provided between the A stage and the B stage. The multiplexers 30, 32 are used to enable various functions for the decimating memory architecture 10 of FIG. 1 as will be described below. Multiplexer 32 receives inputs from the input to forward shifting memory elements 18 and the output of 19 of stage A. Further, the multiplexer 32 provides an output into the first register 24 of the reverse shifting section 16 of stage A. Multiplexer 30 receives inputs from the output of the memory element 20 as well as from the input to memory element 17 of stage A. Further, multiplexer 30 receives the B data stream input $B_{in}$.

The B stage of the decimating memory architecture is constructed similarly to the A stage and includes a decimation register section 12 including a plurality of memory elements, like memory elements being designated accordingly. The B stage includes a forward shifting section 14 and a reverse shifting section 16. The forward shifting section 14 is composed of memory elements 17-19 coupled in series. (It should be noted that when the A and B stages are to be cascaded in-line with other A and B stages that any intermediate B stage will have memory elements 17-20 identical to the A stage. Only the last B stage in-line will have only memory elements 17-19.) Memory element 17 receives its input from the multiplexer 30. Further, the input to each of memory elements 17-19, along with the output of memory element 19, is provided to an individual arithmetic logic unit 27. A multiplexer 40 is provided at the output of the forward shifting section 14 and has one input coupled with the output of memory element 19. Another input to multiplexer 40 is the input to memory element 18.

The reverse shifting section 16 of stage B includes memory elements 21-23 of the decimation register section 12 along with memory element 24 coupled in series. The outputs of each of memory elements 21-24 are also provided to the arithmetic logic units 27. The arithmetic logic units 27 provide outputs B0-B3. The first register 24 of the reverse shifting section 16 receives its input from multiplexer 40. The last register 21 in the reverse shifting section 16 provides its output as an input to multiplexer 32 coupled between the A and B stages.

It will be understood that FIG. 1 illustrates two stages of a decimating memory as may be used to implement a dual filter configuration. However, this is for example only, as the invention requires only a single stage operating in accordance with the teachings herein. Further, the number of decimation registers or memory elements as well as other components in the decimating memory architecture shown in FIG. 1 are also illustrated by way of example only and can be expanded or lessened depending upon the application desired.

As noted above, the A and B stages of the decimation memory architecture 10 can be operated to form multiple configurations. For example, both the A and B stages can be operated as independent decimating memories using the A and B data streams $A_{in}$, $B_{in}$. Further, the A and B stages can be coupled together in-line to form a larger decimating memory. Also, the A and B stages can be further coupled with other A and B stages to even further extend the decimating memory. These various operations will be described below in greater detail.

Each of the decimation registers or memory elements in the decimation register section 12 of both the A and B stages function as first-in, first-out (FIFO) registers to pass the data samples in sequence. However, decimation register 24 for both stages is operable to function as both a last-in, first-out (LIFO) register and a FIFO register.

When operating the A and B stages independently, the input data $A_{in}$ from the first decimation register 17 in the forward shifting section 14 is shifted through the other decimation registers 18 and 19 and is "folded" over to the reverse shifting data section 16 at the center tap of a filter. This "folding" is illustrated via line e<3> provided from the output of memory element 19 into the multiplexer 32 and then into the first memory element 24 in the reverse shifting data section 16. This occurs when line e<3> is enabled as will be described in greater detail with respect to FIG. 2. For the B stage, this likewise occurs as the output from memory element 19 is provided through multiplexer 40 and into the first register 24 in the reverse shifting section 16. The decimation register 20 in the forward shifting section 14 of stage A is only used when the A and B stages are coupled together to form a larger decimating memory. This can be seen from the B stage which does not include a memory element 20 in the forward shifting section 14. As noted above, however, if the B stage were to be cascaded with another stage, then the design of the B stage would be the same as that for the A stage.

The register 24 in both stages can function as a LIFO in order to reverse sequence blocks of the input data samples in each of the decimation registers in the reverse shifting section 16 and thereby fold the data at the center tap of a symmetric filter. The block size of the input data samples corresponds to the decimation rate. The register 24 in the A stage can function as a FIFO when the A and B stages are coupled together to form a longer decimating memory. Similarly, the register 24 in any intermediate B stage can also function as a FIFO when cascading with other stages. The register 24 can also operate as either a FIFO or a LIFO when used as part of an asymmetric filter.

The decimation registers 17-24 can be composed of a shift register memory or, as will be described in the preferred embodiments below, as a random access memory (RAM) having locations which are sequentially addressed to generate the FIFO and LIFO functions. The operation of the RAM memory will be described in greater detail below.

The use of the LIFO register 24 for each stage in this foldover architecture allows the reverse shifting data section 16 to align the input samples in reverse order in each of decimation registers 21-23 so as to properly align with filter coefficients when the decimating memory is used in a filter. As noted above, the decimating memory architecture according to the present invention can be used to implement digital filters.

In a preferred embodiment, the decimation registers 17-24 are decimate 1-16 registers. These registers are thus capable of decimating from one to sixteen in accordance with the depth of the register. For example, a decimate by two filter would have the decimation registers 17-24 set to a depth of two and hence LIFO register 24 would reverse sequence each block of two input samples.

Figure 2:
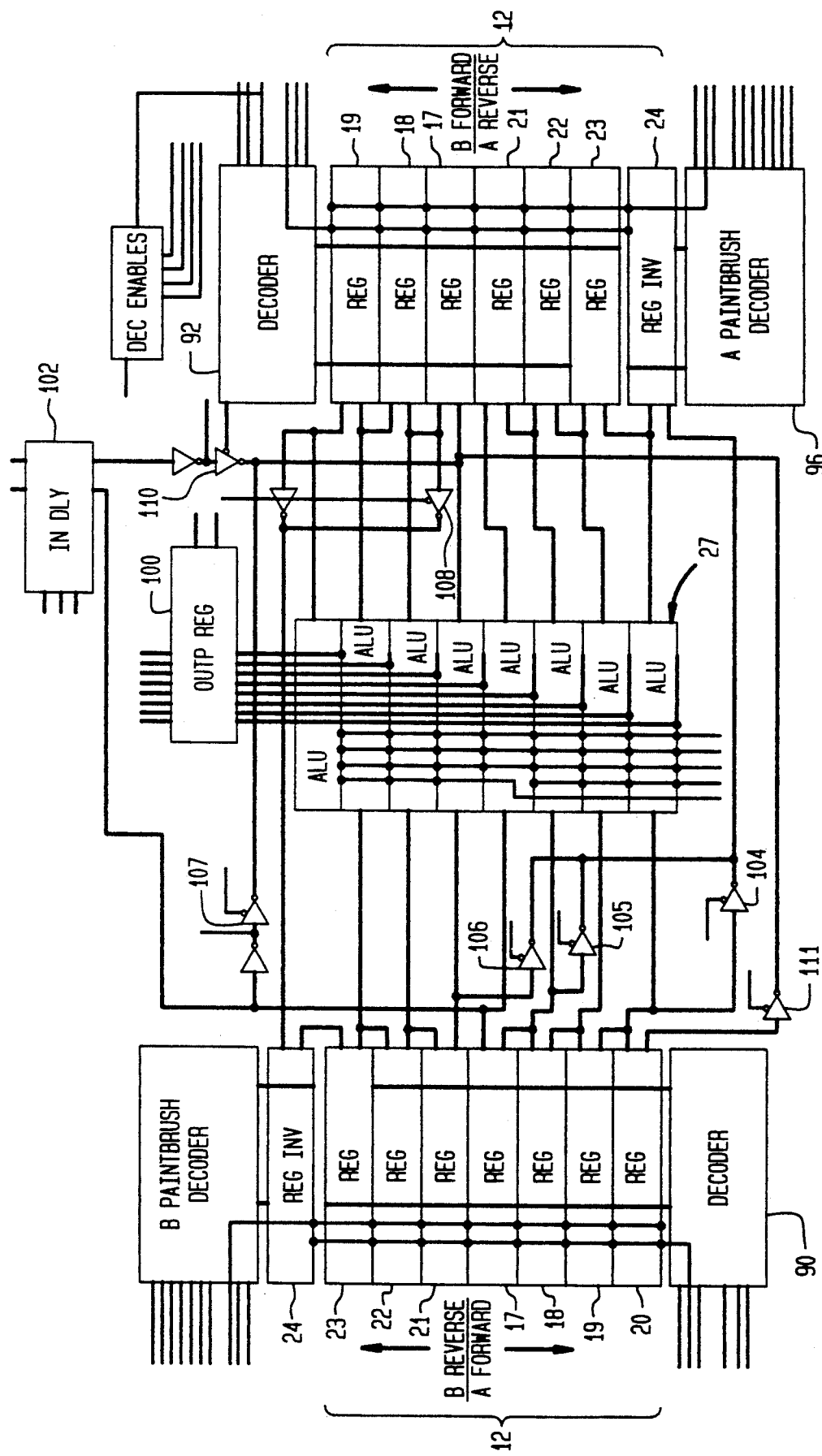
FIG. 2 is a detailed block diagram of the decimating memory of FIG. 1.

FIG. 2 is a detailed block diagram of the decimating memory of FIG. 1 illustrating the use of RAM memories for the decimation register section 12 and the register 24, each register hereinafter being referred to alternatively as a register, memory stage or memory element. An input delay register 102 couples the input data $A_{in}$ to register 17 in the A forward register section and couples $A_{in}$ and $B_{in}$ to multiplexer 30 (FIG. 1 comprising tri-state inverter 107 and 110 of FIG. 2) at the input to register 17 in the B forward register section of the memory. Decoders 90 and 92 are identical designs which are synchronously operated. In order to address the identical location in each of the memories, read address and write address signals are provided from the decoders 90 and 92 to the memories. The read and write addresses are offset to provide the decimation required. Once the operation of the decimating memory functioning as a filter begins, the addressing of the memory is performed sequentially.

Two "paintbrush" decoders 94 and 96 control the first memory stage 24 in the reverse shifting data section 16 (FIG. 1) of the memories, i.e. the "paintbrush" decoder controls the operation of that portion of the memory, i.e. register 24, functioning as a LIFO or FIFO register. The LIFO operation occurs by sequencing data in a back and forth manner, hence the term "paintbrush." Data is written into the memory in one direction, e.g. right to left, then read from the memory in another direction, e.g. left to right, while simultaneously writing new data in that direction, e.g. left to right, after the location has been read. Then, the procedure is reversed by reading right to left while simultaneously writing the memory right to left. The outputs from the registers 17-24 are provided directly to the ALU section indicated generally by 27 as described above for FIG. 1. The outputs from the individual ALUs forming the ALU section 27 are coupled to and output through output register 100.

One paintbrush decoder 94, 96 is used for each of the stages, A and B. The A and B paintbrush decoders 96 and 94, respectively, operate independently; therefore, if the A and B stages function as separate decimation memories for separate filters, both paintbrush decoders will function to control their respective registers 24 as a LIFO buffer. However, if the two stages are cascaded together, then the paintbrush decoder 96 functions to control the A stage memory element 24 as a FIFO buffer and the paintbrush decoder 94 will operate the B stage memory element 24 as a LIFO buffer. This operation is in accordance with keeping the middle of the filter or "fold" of the filter as a LIFO function to reversely sequence the blocks of data samples.

Tri-state inverters 104-111 are utilized to implement the required multiplexing shown schematically in FIG. 1 as multiplexers 30, 32 and 40. This minimizes the amount of interconnect bussing necessary between the registers and the ALU's. This allows the ALU's to remain connected to the same memory elements. The data is moved between the memory elements to align the data at the proper ALU inputs.

Tri-state inverter 104 is enabled by signal $e<3>$ and couples the output of register 19 in the forward shifting section 14 of stage A to register 24 in the reverse shifting section 16 of stage A. Tri-state inverter 105 is enabled by signal $e<2>$ and couples the input of register 18 in the forward shifting section 14 of stage A also to the register 24 in the reverse shifting section 16 of stage A. Tri-state inverter 106 is enabled by signal $e<1>$ and couples the output from register 21 in the reverse shifting section 16 of stage B to register 24 in the reverse shifting section 16 of stage A. Tri-state inverter 107 is enabled by signal $e<0>$ and couples the input to register 17 in the forward shifting section 14 of stage A to the input of register 17 in the forward shifting section 16 of stage B such that the A and B stages operate independently as two filters using the same input data, i.e. $A_{in}$ is provided to register 17 in both the A and B stages.

Tri-state inverter 108 couples the input of register 18 in the forward shifting section 14 of stage B to the register 24 in the reverse shifting section 16 of stage B. Tri-state inverter 109 couples the output of register 19 in the forward shifting section 14 of stage B to register 24 in the reverse shifting section 16 of stage B. Both tri-state inverters 108 and 109 are enabled by signal $e<4>$ with tri-state inverter 108 enabled by a low signal $e<4>$ and tri-state 109 enabled by a high signal $e<4>$. Tri-state inverter 110 is enabled by signal $e<5>$ and couples the input data stream $B_{in}$ from input delay register 102 to the input register 17 in the forward shifting section 14 of stage B. Tri-state inverter 111 is enabled by signal $e<1>$ and couples the output of register 20 in the forward shifting section 14 of stage A to register 17 in the forward shifting section 14 of stage B for cascaded operation.

Figure 13:
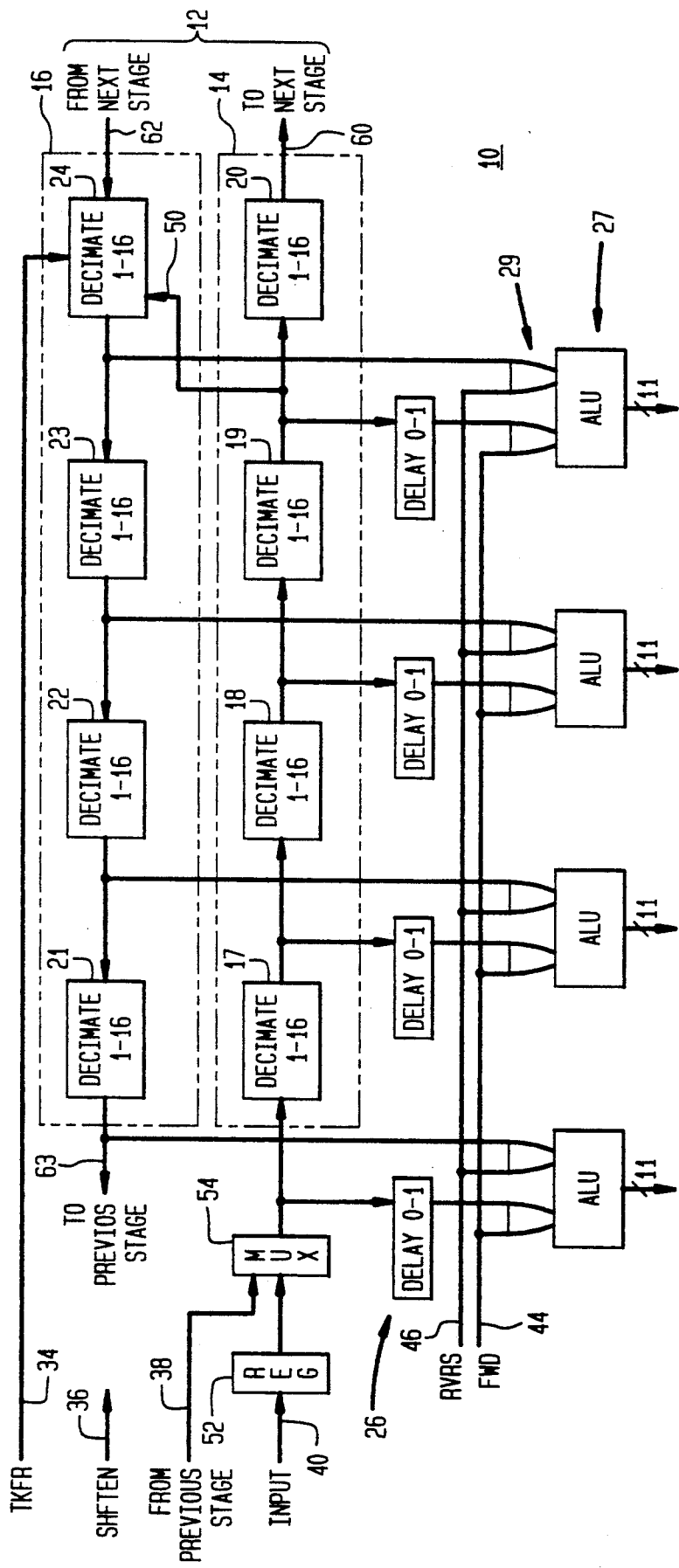
FIG. 13 is a block diagram illustrating an implementation of a decimation circuit.
Figure 14:
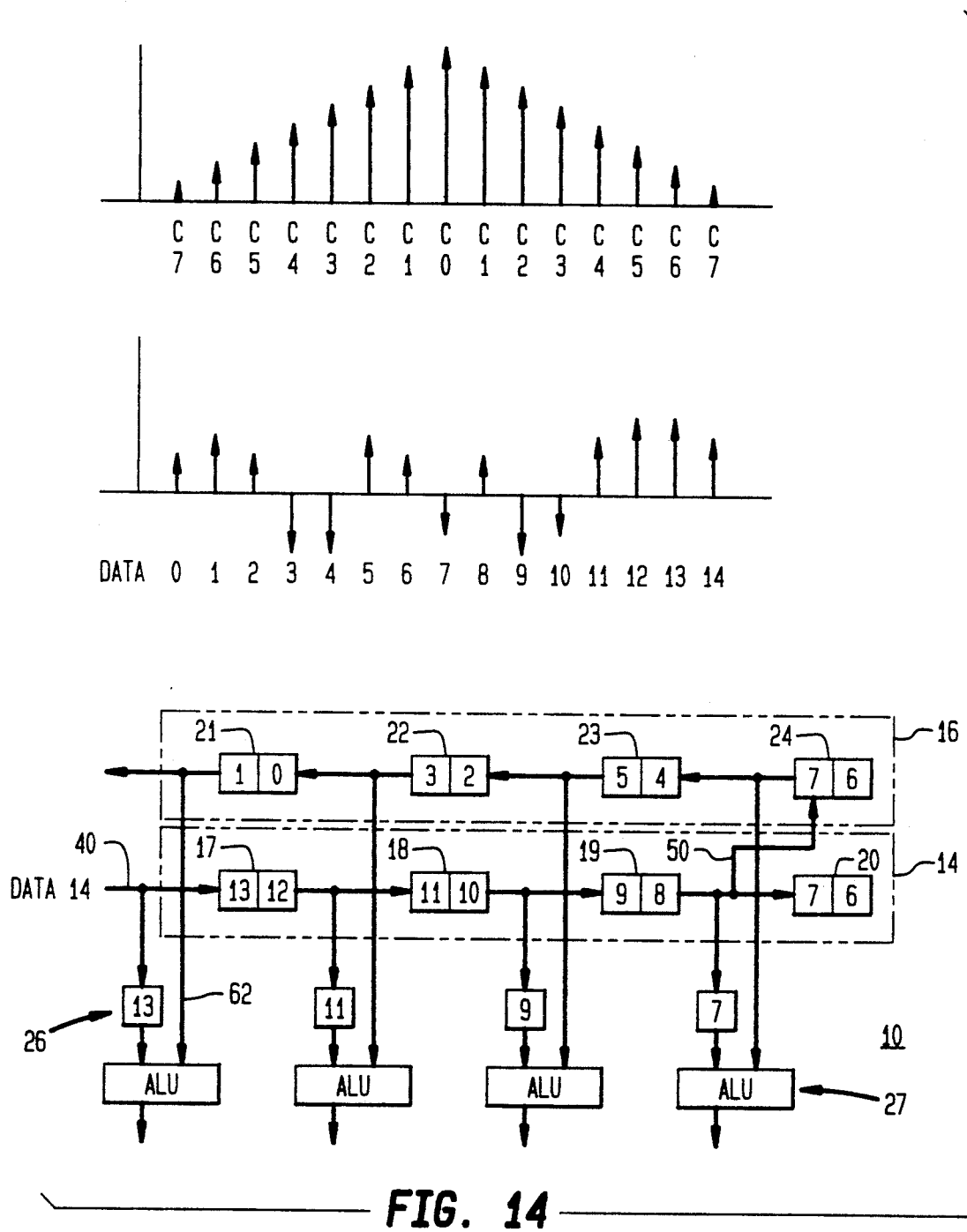
FIG. 14 is a functional block diagram and graphical representation of the operation of FIG. 13.

The enabling of tri-state inverter 108 via signal $e<4>$ low routes the data from the input of register 18 in the forward path of stage B to the input of the first register 24 in the reverse path of stage B. This provides zero amount of delay (henceforth referred to as accelerating the data) in the reverse path to align the feedback data with the forward data and therefore eliminate delays 26 as shown in FIGS. 13 and 14 normally required to align data. Register 20 is eliminated in the B stage of FIGS. 1 and 2 because the B stage cannot be cascaded in the dual filter configuration shown. As noted above, if the B stage were to be allowed to be cascaded then the design of stage A would also be used for stage B.

The tri-state inverters 104, 105, 106 determine what data goes into the reverse shifting section of stage A, e.g. tri-state 104 is used when not cascading filter sections, for asymmetric filters, even number of tap symmetric filters, or odd number of tap symmetric filter data except for the center tap data. Tri-state 105 is used to accelerate the center tap data in the odd number of tap symmetric filter case when not cascaded; and tri-state 106 is used when the two stages are cascaded together.

The tri-states 108 and 109 determine what data goes into the reverse shifting section of stage B, e.g. tri-state 108 is used to accelerate the center tap data for odd number of tap symmetric filters as previously outlined; otherwise tri-state 109 is used.

Tri-state inverters 107, 110 and 111 determine what data goes into the forward shifting section of stage B, e.g. tri-state 107 routes stage A input data $A_{in}$ to stage B input; tri-state 110 routes B input data $B_{in}$ to stage B input; and tri-state 111 routes data from the forward shifting section 14 of stage A to the forward shifting section 14 of stage B, i.e. for cascaded stages. The following table summarizes the function obtained when each of the tri-state inverters are enabled via signals $e<0>$ to $e<5>$:

| Signal | Status | Function |
| --- | --- | --- |
| e<0> | low | Ain to B chain (two filters, same data) |
| e<1> | low | B reverse output to A reverse input and A forward output to B forward input (cascade) |
| e<2> | low | accelerate center tap data from A forward to A reverse (no cascade) |
| e<3> | low | all non-accelerated data from A forward to A reverse (no cascade) |
| e<4> | low | accelerated center tap data to B reverse |
| e<4> | high | all non-accelerated data to B reverse (normal) |
| e<5> | low | Bin to B chain (two filters, different data) |

The decimating memory architecture of the present invention as shown in FIG. 2 allows both symmetric and non-symmetric or asymmetric filters to be implemented if the arithmetic logic units 27 provide the following capabilities with respect to the data samples from stages A and B: a, b, a−b or b−a, and a+b. The a and b data inputs for each ALU are from the same stage A or B. The a inputs to the ALU 27 are provided from the reverse shifting data sections and the b inputs are from the forward shifting data sections as shown in FIG. 1. Asymmetric filters use the data individually per tap a, b. Even symmetric filters add data samples (a+b) prior to the multiplier, and odd symmetric filters subtract data samples (a−b or b−a) prior to the multipliers.

For operation as an asymmetric filter, the a or b input is processed through a multiplier providing a filter at the maximum input rate but containing only one-half the maximum number of taps provided. Alternatively, the a or b input is processed through a multiplier followed by the other input. Next, the memory is advanced to its next location. Asymmetric filters therefore can operate at one-half the rate of a symmetric filter having the same maximum number of filter taps. The decoders 90 and 92 shown in FIG. 2, must perform shift, hold and reset to an initial state functions. The paintbrush decoders 94, 96 must perform shift left, shift right, hold and reset to an initial state functions. For a complete description of the operation of the various filters which can utilize the decimating memory, reference can be made to co-pending application Ser. No. 07/774,628 as noted above.

In an advantageous embodiment, the memory elements 17-24 are dual port RAM memories. This minimizes the system power required as only one data word is written per access to the memory. This further has the advantage over conventional shift register configurations wherein all of the words are changed per access. While a dual port RAM is used in an advantageous embodiment, it is well understood that any type of RAM memory could be used with appropriate modifications, e.g., a single port RAM could be employed using a write access followed by a read access. However, it should also be noted that some of the same advantages can be obtained with shift registers if the proper control switching is provided.

As shown in FIG. 2, by combining the ALU 27 with the memory, the number of interface lines from the decimating memory are reduced by approximately one-half per filter tap. Further, using a RAM memory for memory elements 17-24 rather than a shift-register reduces the logic in implementing the variable length FIFO structure and the LIFO/FIFO structure. The data in FIG. 2 is arranged within the memory through proper control switching such that the ALU 27 always connects to the same memory element input or output. This reduces the interconnect and delay from the memory through the ALU.

The FIG. 2 configuration can advantageously be implemented using a two or more level metal CMOS process. The ALUs 27 can be placed under the output busses from the ALUs 27 to the output register 100. This, in effect, requires no additional space on the chip than that required by the output bus. The decoders 90, 92 can be duplicated as shown on both sides of the chip because it requires less area to build separate decoders and route common control lines than is required to build a single decoder and route common memory address lines.

The configuration of FIGS. 1 and 2 does not require the memory addressing to wrap over the top of memory address space, thus simplifying the address decoder design when a shift register is used as an address decoder. Shift register address decoders are shown in FIG. 2, but conventional random access decoders could also be used with proper address generation circuitry.

The operation of the memory in FIG. 2 to provide decimation functions as well as to function as decimation registers 17-24 shown in FIG. 1 will now be described with reference to only a single stage in operation (hence memory element 20 shown in stage A is omitted).

Figure 3B:
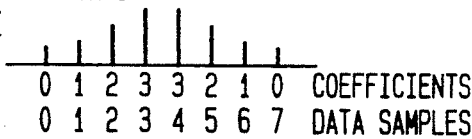
FIGS. 3a and 3b are a block diagram example and a graphical representation, respectively, of the operation for the decimating memory of FIG. 2.
Figure 3B:
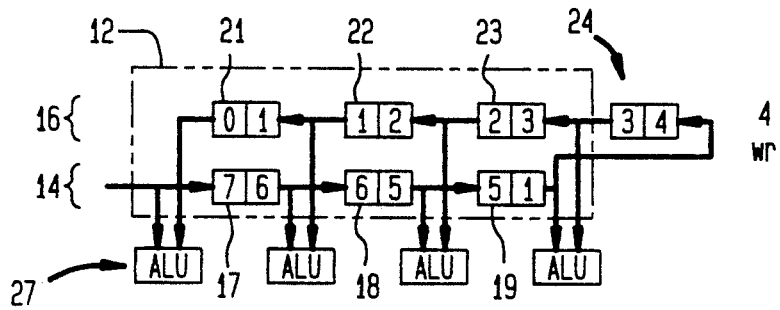
Figure 3A:
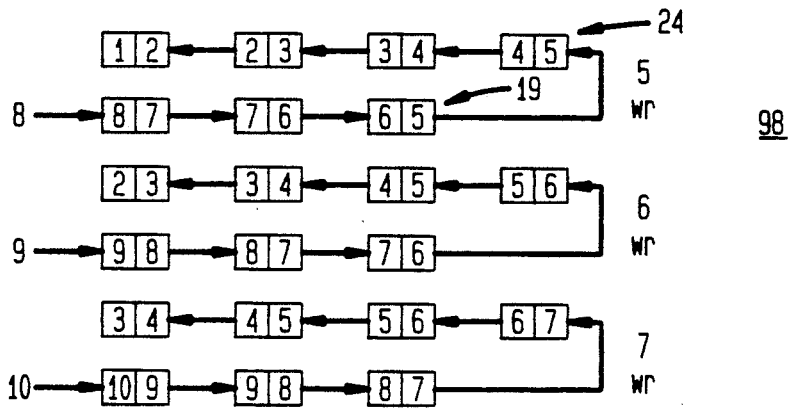

Referring to FIG. 3a, an example of a decimate-by-one memory having an even number of taps is shown. A corresponding graph of filter coefficients (for an even symmetry, even number of tap FIR filter) versus input data samples is given in FIG. 3b. The decimation memory composed of decimation register section 12 and register 24 includes a number of memory elements 17-19 and 21-24. In each upper memory element, i.e. the reverse shifting section 16, the left memory cell represents the memory output and the right memory cell represents the memory. For the lower memory elements, i.e. the forward shifting sections 14, the right cell represents the memory output and the left cell represents the memory. The memory outputs from the forward shifting section 14 and reverse shifting section 16 are provided to the ALU section 27. The right most register 24 in the reverse shifting section 16 functions as the LIFO buffer in accordance with the read pointer R and write pointer W which point to the same memory location, e.g. four (4) in FIG. 3a. What is written into the memory elements at the beginning of a clock cycle is then read at the end of the cycle and transferred to the output at the beginning of the next cycle. This operation is shown in the bottom section 98 of FIG. 3a wherein the ALUs 27 are omitted for simplicity. It is readily understood that FIG. 3a does not indicate the actual memory storage but only the storage cells that are of current interest for illustrating the operation. All of the other memory elements 17–19 and 21–23 function as FIFO memories having their read and write pointers set to the same locations. The LIFO/FIFO buffer 24 can operate as either function because the read and write pointers address the same location.

Figure 4B:
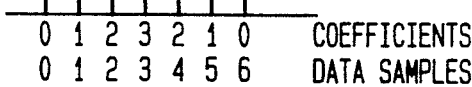
FIGS. 4a and 4b are a block diagram example and a graphical representation, respectively, of the operation of the decimating memory of FIG. 2.
Figure 4A:
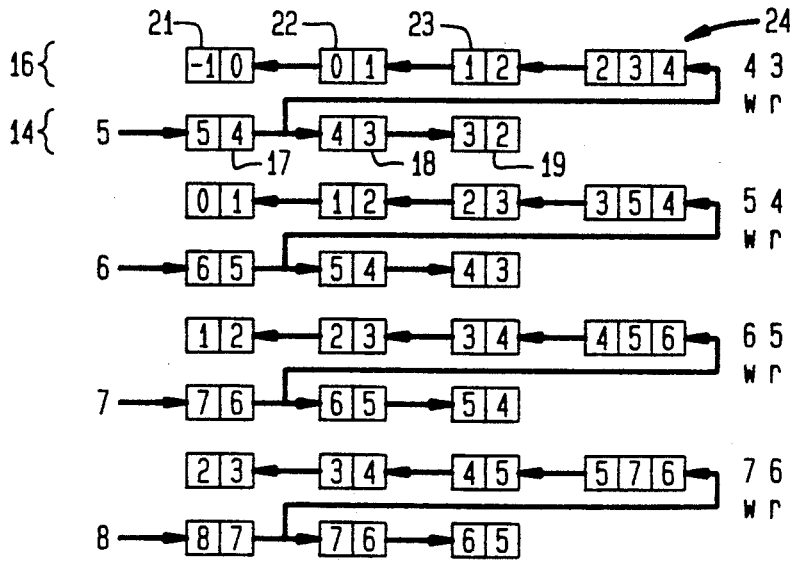
Figure 5B:
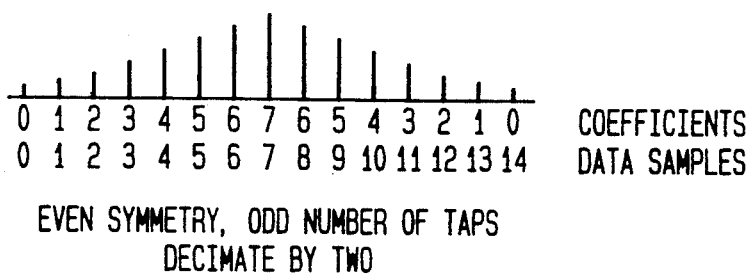
FIGS. 5a and 5b are a block diagram example and a graphical representation, respectively, of the operation of the decimating memory of FIG. 2.
Figure 5A:
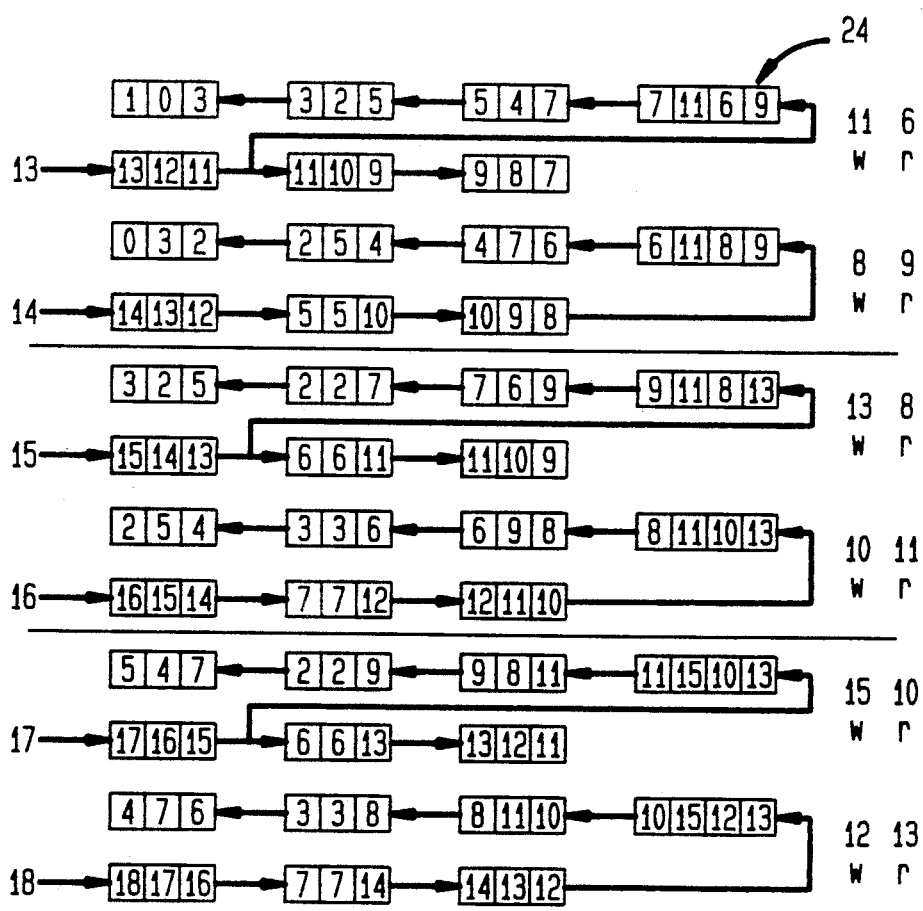

FIGS. 4a and 4b illustrate the operation for a decimate-by-one memory with an odd number of taps. In this example, the read and write pointers for the LIFO/FIFO memory element, i.e. the upper right stage 24 in the reverse shifting data section, are offset by one location. It is important to note that the LIFO buffer for an odd number of taps requires an additional storage location than is used for the FIFO buffers, i.e. LIFO 24 contains three elements whereas the other registers require one less location. An alternative arrangement will be described below wherein the additional location is not necessary. FIGS. 5a and 5b illustrate the operation of FIG. 2 for a decimate-by-two memory having an odd number of filter taps. In this example, all FIFO read pointers follow the write pointer by one location. Again, for a filter with an odd number of taps, the upper right memory element 24 functions as a LIFO memory having an additional storage element. Data is folded over at the rate of the decimation factor, or every two data samples.

Figure 6B:
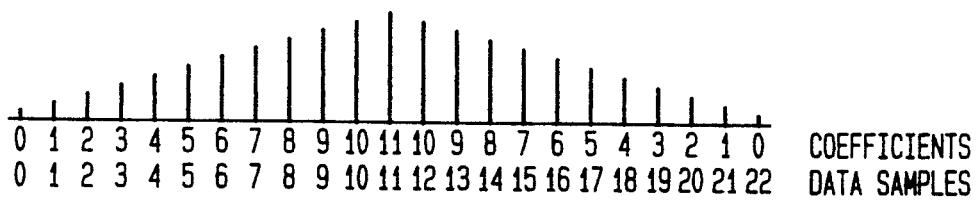
FIGS. 6a and 6b are a block diagram example and a graphical representation, respectively, of the operation of the decimating memory of FIG. 2.
Figure 6A:
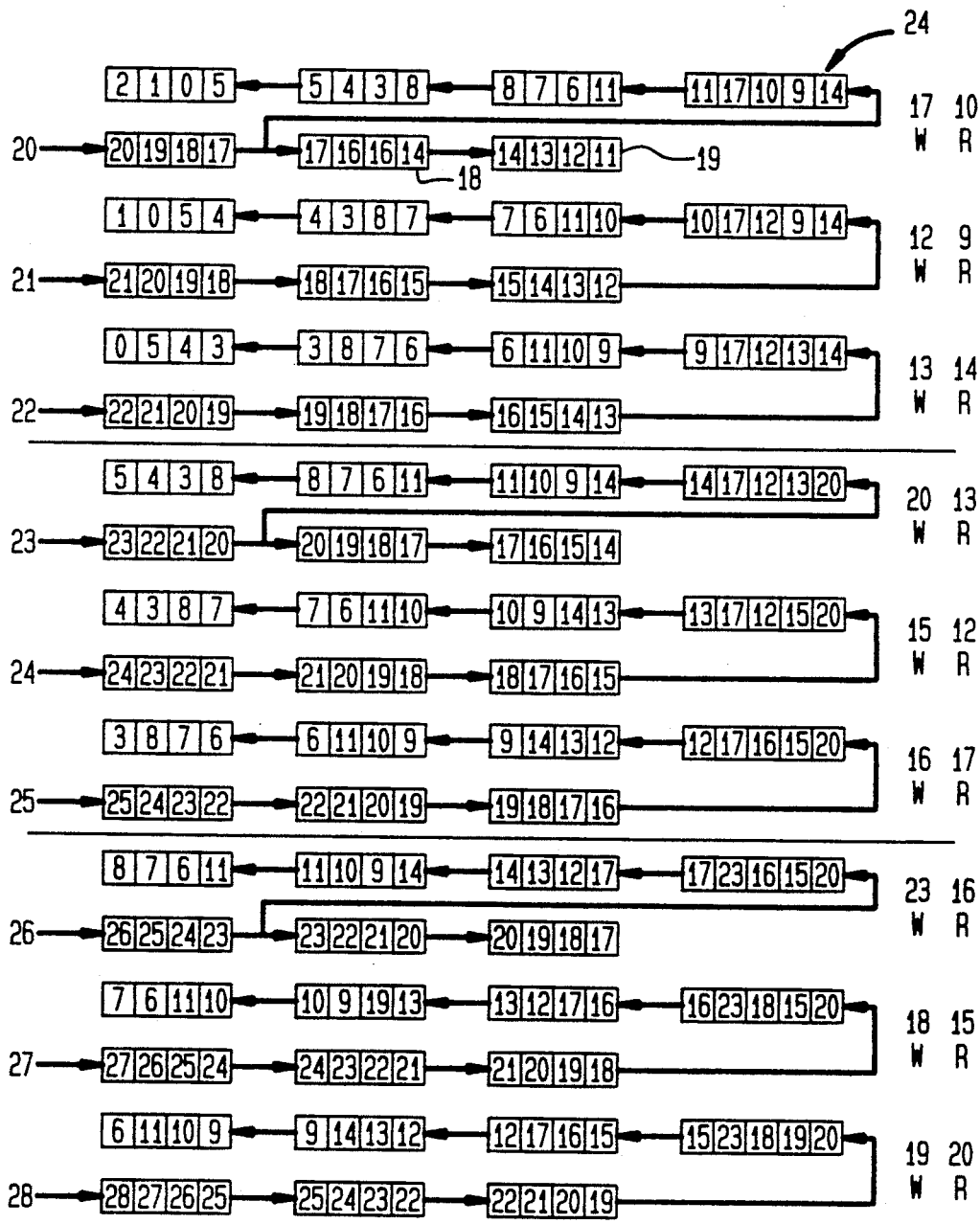

FIGS. 6a and 6b illustrate a further example of the operation of FIG. 2 for a decimate by three memory having an odd number of taps. In this case, the FIFO read pointer follows the write pointer by two locations. Data is turned around at the rate of the decimation factor, or every three data samples.

Figures 7A, 7B:
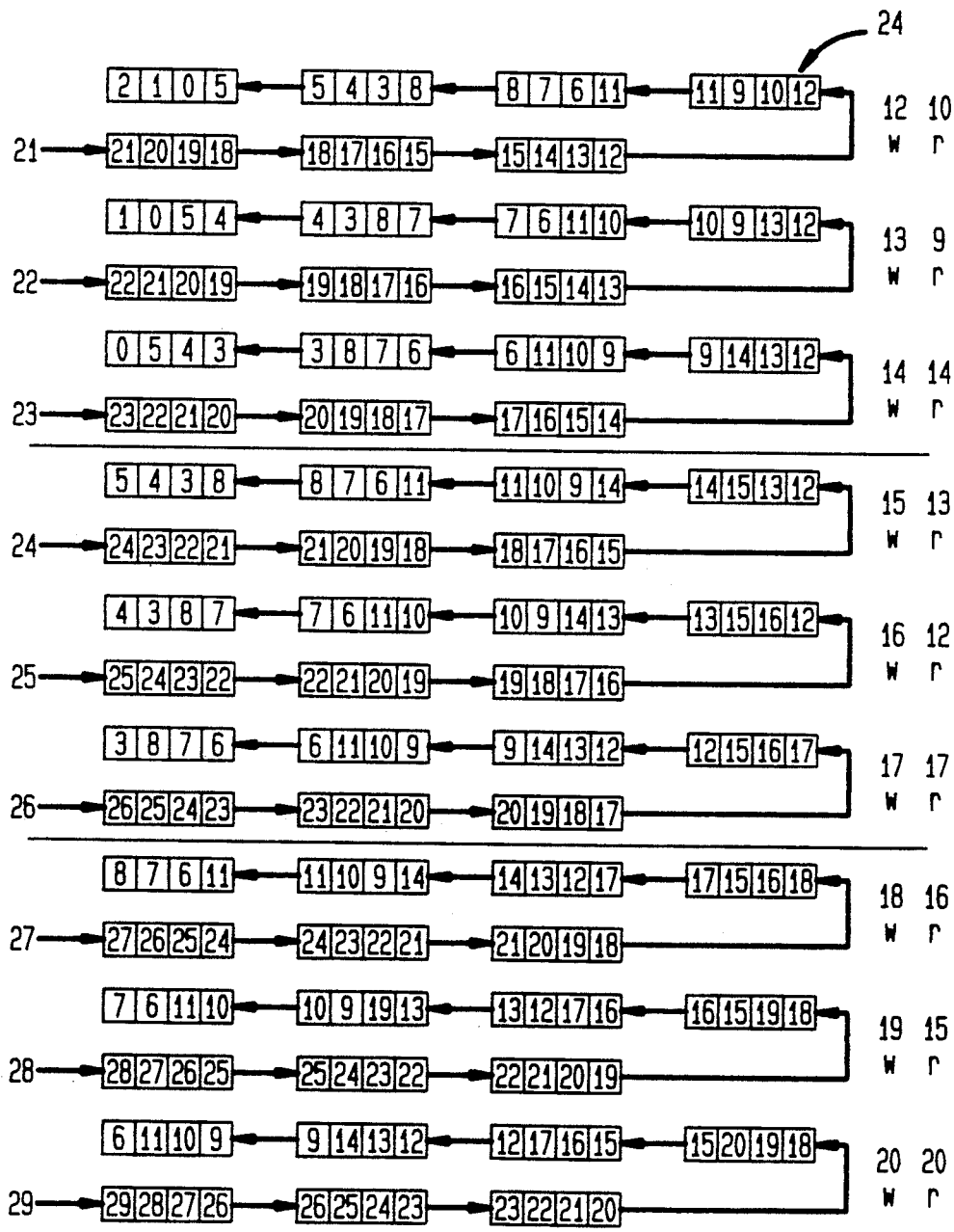
FIGS. 7a and 7b are a block diagram example and a graphical representation, respectively, of the operation of the decimating memory of FIG. 2.

FIGS. 7a and 7b illustrate a further example of the operation of FIG. 2 for a decimate by three memory having an even number of taps. In this case, the FIFO read pointer follows the write pointer by two locations. The LIFO/FIFO register 24 is operated as a LIFO register and the data is turned around at the decimation factor or every three data samples.

Figure 8:
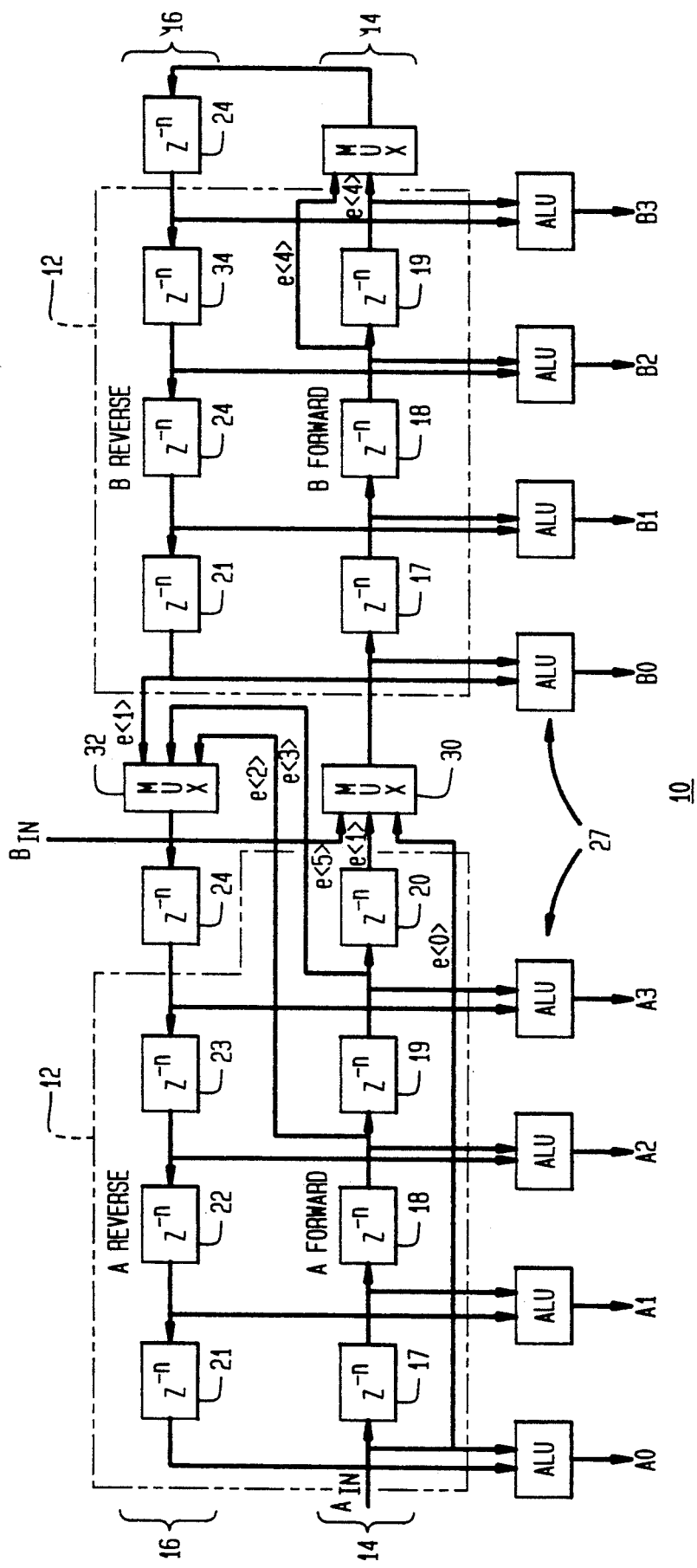
FIG. 8 is a simplified schematic block diagram of a preferred embodiment of the decimating memory according to the present invention.
Figure 9:
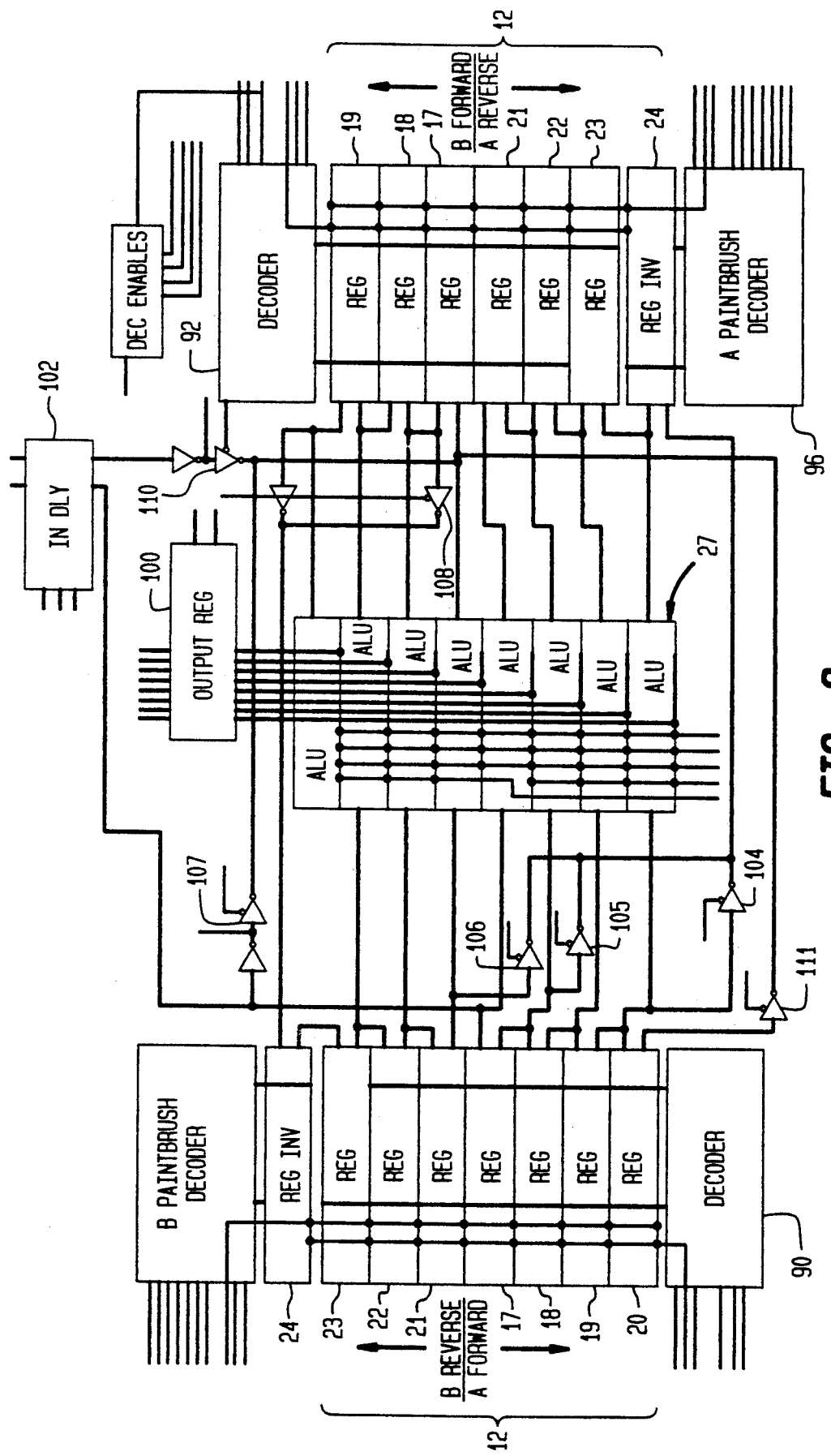
FIG. 9 is a detailed block diagram of the decimating memory according to FIG. 8.

Referring to FIGS. 8 and 9, an especially preferred embodiment of the decimation memory of the present invention is shown wherein the additional storage cell required in LIFO register memory element 24 in FIGS. 4a, 5a and 6a for odd number of tap cases is eliminated via the addressing of the LIFO register 24. FIGS. 8 and 9 are substantially similar to FIGS. 1 and 2 but have different connections for tri-state inverters 105 and 108 as well as a reduced size paintbrush decoder memory element 24. The tri-state inverters 105, 108 are moved-up one stage in the memory output from their location in FIG. 2 so as to properly align data in the LIFO register 24 such that the data for the center of a filter is properly processed. FIG. 2 shows the data from the input to delay memory element 18 passing through inverters 105, 108 wherein FIG. 9 shows the data from the input to delay memory element 19 going through inverters 105, 108 for stages A and B. As with FIG. 2, the tri-state inverters 104, 105, 106 determine what data goes into the reverse shifting section of stage A, e.g. tri-state 104 is used when not cascading and asymmetric filters, even number of tap symmetric filters, or odd number of tap symmetric filters except for the center tap data. Tri-state 105 is used to accelerate center tap data in the odd number of tap symmetric filter case, i.e. center tap, when not cascaded; and tri-state 106 is used when two stages are cascaded together.

The tri-states 108 and 109 determine what data goes into the reverse shifting section of stage B, e.g. tri-state 109 is used for asymmetric filters, even number of tap symmetric filters or odd number of tap symmetric filters and not center tap, i.e. no acceleration; otherwise tri-state 108 is used to accelerate data in odd number of tap symmetric filter cases, i.e. center tap data.

Tri-states 107, 110, 111 determine what data goes into the forward shifting section of stage B e.g. tri-state 107 routes A input data to stage B input; tri-state 110 routes B input data to stage B input; and tri-state 111 routes data from the forward shifting section of stage A to the forward shifting section of stage B, i.e. for cascaded stages.

Figure 10:
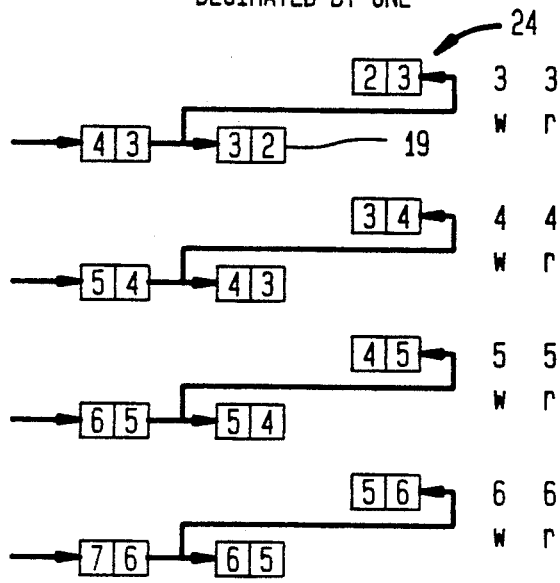
FIG. 10 is a block diagram example of the operation of the decimating memory of FIG. 8.
Figure 11:
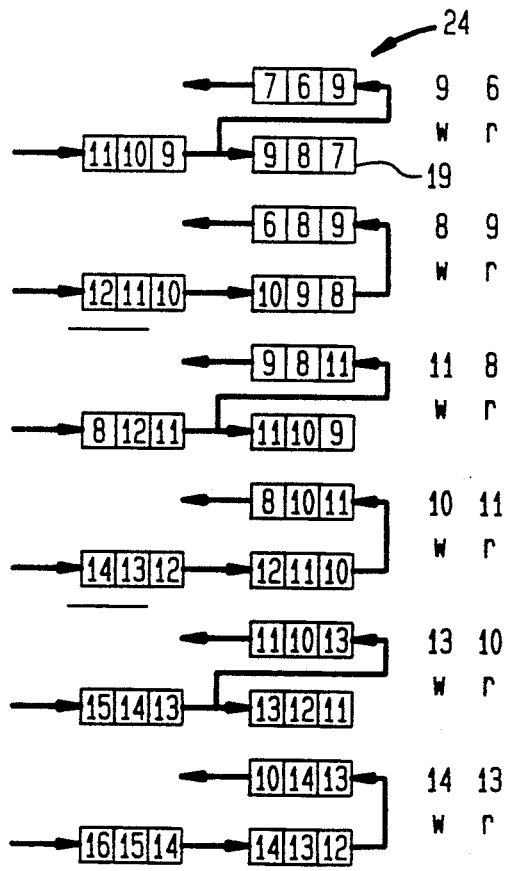
FIG. 11 is a block diagram example of the operation of the decimating memory of FIG. 8.
Figure 12:
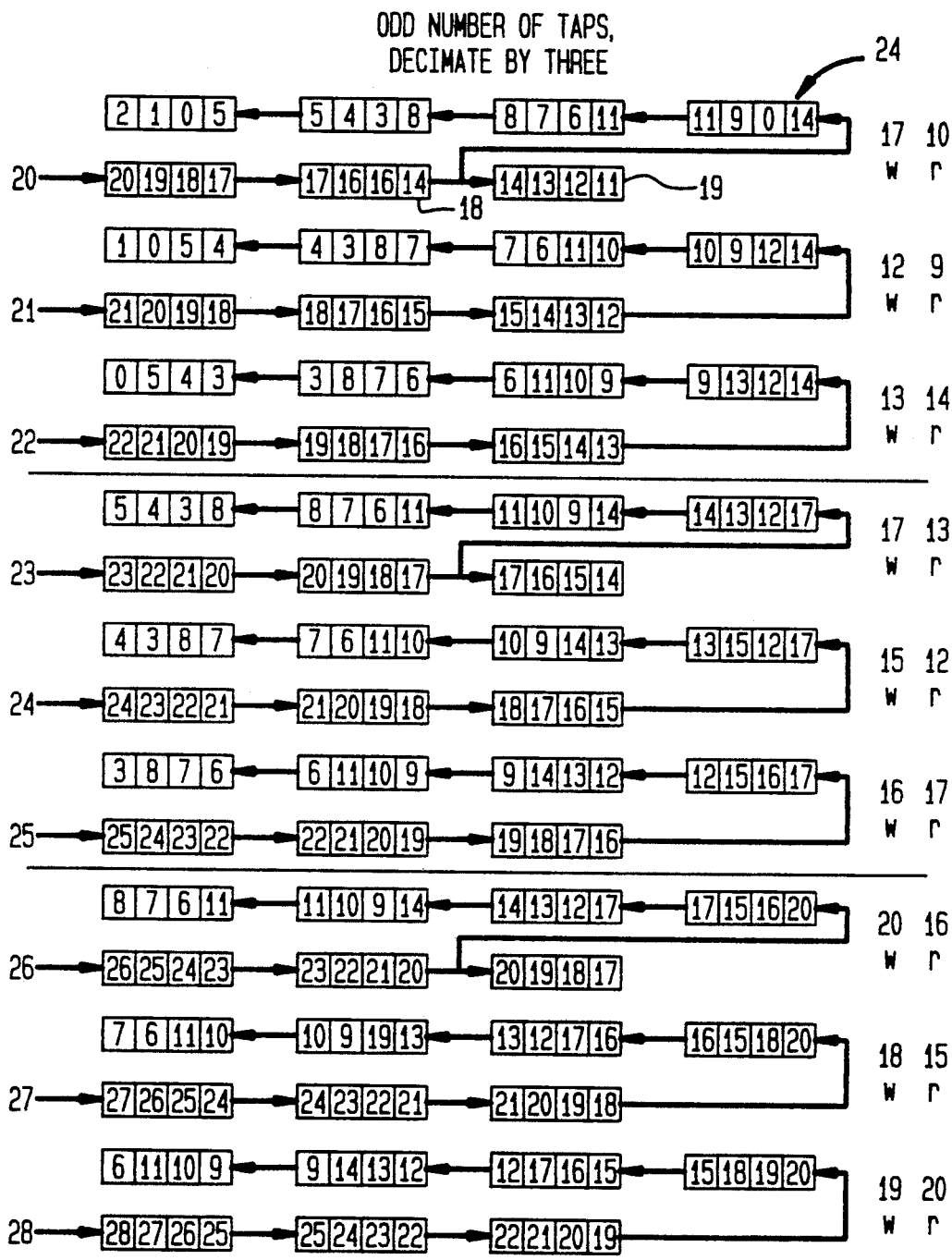
FIG. 12 is a block diagram example of the operation of the decimating memory of FIG. 8.

As noted above, the odd number of tap cases shown in FIGS. 4a, 5a and 6a require that the paintbrush decoder memory, i.e. LIFO register 24, have one additional storage element in the memory than the FIFO memories 17–23. However, FIGS. 8 and 9 provide an arrangement which only requires as much LIFO memory storage as is required for the FIFO's. Examples of these addressing schemes are given for odd number of tap symmetric filter cases that are decimate by one (FIG. 10), decimate by two (FIG. 11) and decimate by three (FIG. 12). For odd number of tap filters (FIG. 12), the input to LIFO register 24 comes from the input to register 19 (the last actively used forward FIFO) when the center tap sample is present at the output of FIFO 19 and LIFO 24. For all other cases (asymmetric filters or even number of tap symmetric filters or odd number of tap symmetric filters, when the center tap data is not present at the output of LIFO 24 and FIFO 19) the input to LIFO 24 will be the output of FIFO 19. If the implementation of FIG. 2 is used, then the input to LIFO 24 comes from the input to FIFO 18 when the center tap sample is present at the outputs of FIFO 19 and LIFO 24 for odd number of tap symmetric filters and from the output of FIFO 19 at all other times.

The paintbrush decoders 94 and 96 control the LIFO register 24 such that it functions as a $MOD_N$ length memory wherein N is the decimation factor. Therefore, for the decimate by three case shown in FIG. 12, he memory is $MOD_3$ or a three element memory. Using the top LIFO register 24 shown in FIG. 12 wherein the LIFO memory locations containing input sample eleven (output register), nine, ten and fourteen are labelled as: output register, 2, 1, 0, respectively, then the write address top to bottom of FIG. 12 is:

| | |
|---|---|
| 0 | |
| 1 | up |
| 2 | up |
| 0 = 3MOD₃ | up |
| 2 | down |
| 1 | down |

| | |
|---|---|
| 0 | down |
| 1 | up |
| 2 | up |

Write address $0=3MOD_3$ will cause a shift register used to address the LIFO register 24 to address (write) locations 0 and 3, if the actual length of the register is longer than four. Writing two locations is permissible, but reading two locations with different data causes an ORing of the data. Therefore, reading of addresses higher than zero are inhibited when reading zero. Thus, the write addressing wraps over the top of the memory and then back down again.

The addressing for an even number of taps case, decimate by three, FIG. 7, is as follows:

| | |
|---|---|
| 0 | |
| 1 | up |
| 2 | up |
| 2 | hold |
| 1 | down |
| 0 | down |
| 0 | hold |
| 1 | up |
| 2 | up |

These up/down and up/hold/down/hold sequences describe the term paintbrush for the decoders 94 and 96.

The acceleration of data via the addressing schemes of FIGS. 2 and 9 during the odd tap case allows delay registers previously required for odd tap filters to be eliminated in these implementations. These delay registers can be seen in FIG. 13 which is a block diagram of decimation circuitry 10 for a single stage, such as stage A of FIG. 1, that can be used to implement a digital filter. In FIG. 13, the decimation circuitry includes registers 17-24 in the decimation section 12 having outputs which are provided to arithmetic logic units (ALUs) 27, through AND gates indicated generally at 29. One output each from a forward shifting decimation register and a reverse shifting decimation register is provided to each of the ALUs 27 through respective AND gates 29. These AND gates 29 have as their other input a forward (FWD) signal line 44 and a reverse (RVRS) signal line 46 for enabling the gates 29 to pass the output information to the ALUs 27. The ALUs 27 provide their output to a filter stage (not shown).

The decimation registers 12, as mentioned above, include a forward shifting data section 14 and a reverse shifting data section 16. The input data 40 is supplied through a register 52 and multiplexer 54 before being provided as an input to the first decimation register 17 in the forward shifting data section 14. At the same time, this input data from the multiplexer 54 is provided through the delay element 26 to the ALUs 27 when the forward line 44 is enabled.

The input data from the first decimation register 17 in the forward shifting data section 14 is shifted through the other decimation registers 18-20 and is "folded" over to the reverse shifting data section 16 at the center tap. This "folding" is conceptionally illustrated via line 50 from decimation register 19 which provides an input to the first reverse shifting decimation register 24 as well as to the final decimation register 20 in the forward shifting section. The input data is then shifted backward through decimation registers 23, 22 and 21. At the same time, each of the registers provides an output to the ALUs 27. The reverse shifting register section 16 is used to take advantage of the symmetry of linear phase filters and is used to hold additional data for asymmetric filters whenever a trade-off between the processing rate through the filter and the filter length is desired. Multiplexing the data from the forward and reverse registers to a filter multiplier (not shown) during each input data clock cycle doubles the filter's tap length but reduces the input data rate to ½ the multiplexing rate.

Again as noted above, the forward data can pass through an additional single delay stage 26 to align the data properly for symmetrical filters. The use of the delay depends upon whether the symmetric filter has an even or odd number of taps, i.e. an odd number requires a delay whereas an even number of taps does not.

FIG. 14 illustrates a one-dimensional symmetric filter's data flow for a 15 tap (even symmetry) decimate-by-two circuitry as shown in FIG. 13. As noted above, the decimation registers or memory elements 17-24 are set to a depth of two and are illustratively shown with the data sample, i.e. 0-14, in the memory elements 17-24. Data is input to the forward shifting register section 14 via line 40. Data from the forward shifting section 14 is delayed in delay stage 26. The ALUs 27 receive one input from the delay registers 26 and the other input from the reverse shifting register section 16.

The delay stage 26 is shown containing the output data from the forward shifting decimation registers in order to align the data for an odd number of taps in the filter. In this manner, the coefficients which are input to the filter, will receive the proper data.

Figure 15:
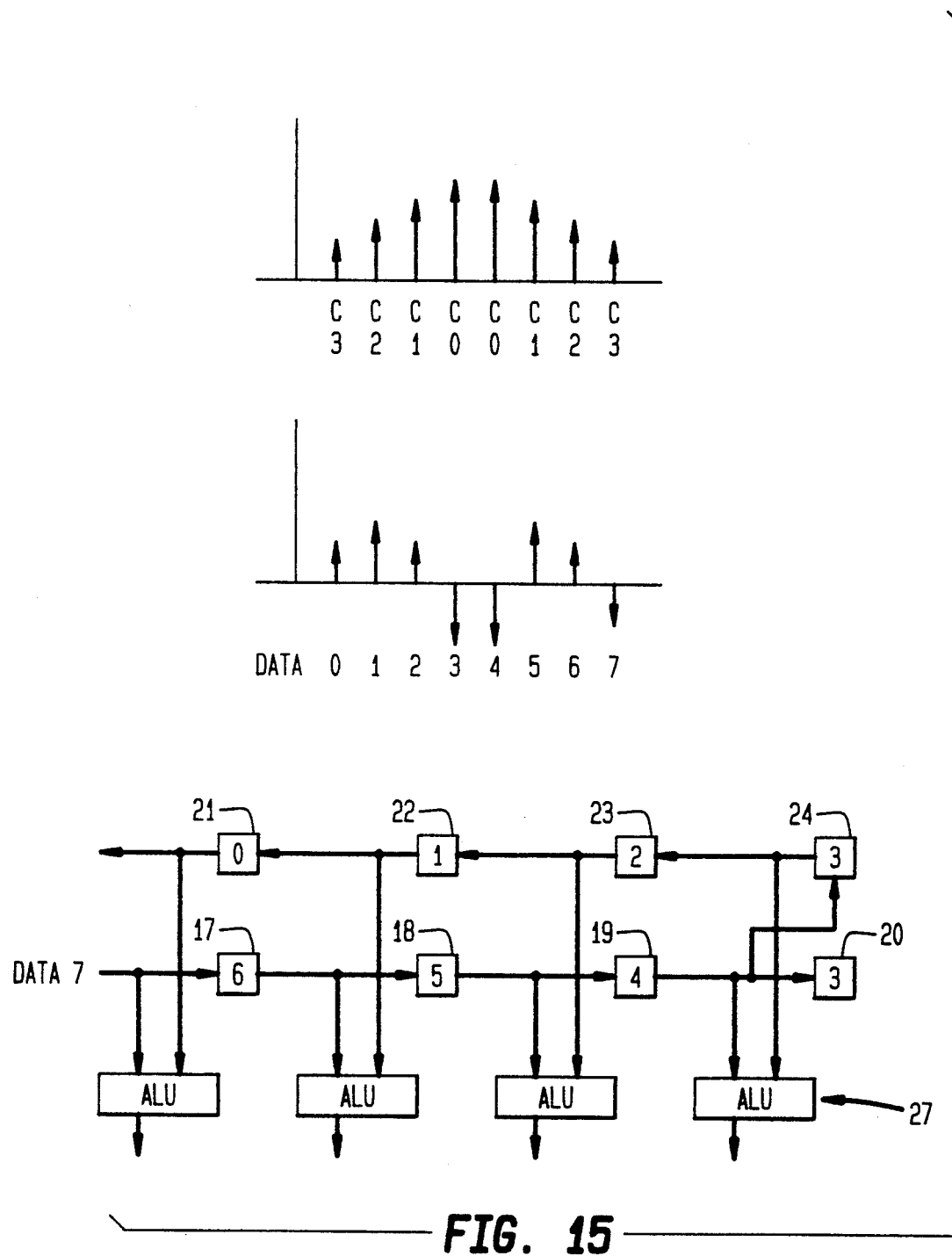
FIG. 15 is a functional block diagram and graphical representation of the operation of FIG. 13 without a delay stage.

The example of FIG. 14 given above is for decimation circuitry which can be used for an FIR stage having even symmetry and an odd number of taps wherein the two data sample values are added in ALU 27 prior to being provided to the filter stage. For a symmetric filter having both even symmetry and an even number of taps, as is shown in FIG. 15 (no decimation shown), the data samples are also added in ALU 27 prior to the filter stage. It should be noted, however, that for odd symmetry cases, one data sample is subtracted from the other in ALU 27. FIG. 15 shows the data flow through the memory elements 17-24 for a symmetric eight-tap filter having an even number of coefficients and no decimation as evidenced by the depth of the registers or memory elements 17-24, i.e. registers 17-24 have a depth of one.

In FIG. 15, the feedback data arrives one cycle earlier and therefore the feedforward data need not be delayed prior to the ALU 27, hence eliminating the delay registers 26.

Figure 16:
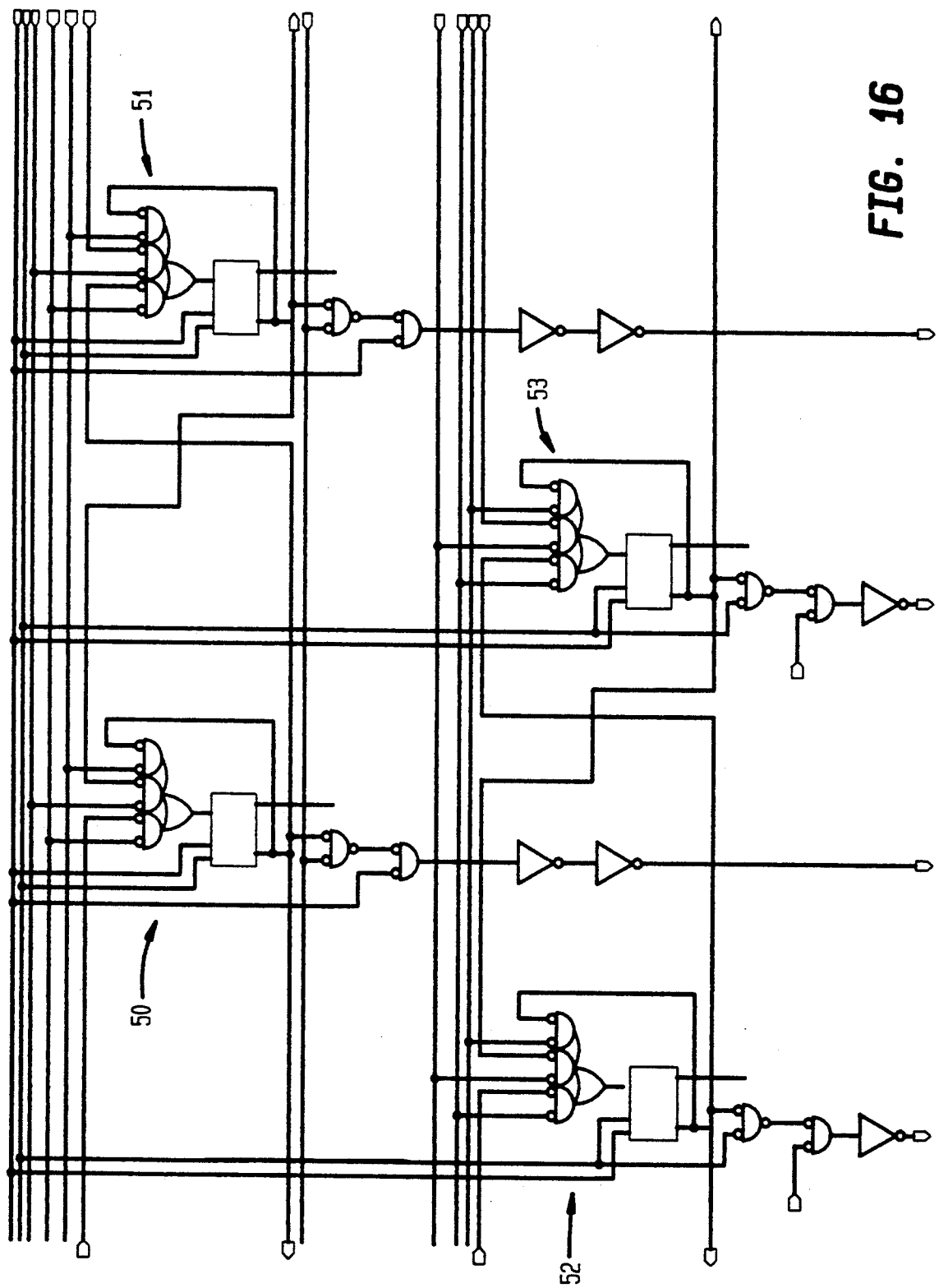
FIG. 16 is a schematic diagram of the addressing logic of a paintbrush decoder in FIG. 8.

FIG. 16 provides a schematic diagram for implementing the addressing scheme of the paintbrush decoder using shift registers and logic gates. Using this scheme, the size of the LIFO can be reduced so as to conform with the size of the FIFO's.

FIG. 16 can be divided into several sections. The two flip-flops at the top of the figure and all the associated logic and lines 50, 51 are used to generate the write addresses for the paintbrush registers 94, 96. Since there are two flip-flops in this one cell, and the cell is used eight times to generate the sixteen addresses needed, it is understood that when reference is made to the flip-flop to the right, it is actually the next flip-flop to the right, whether it is in the current cell or in the next cell over (not shown). Additionally, because the addressing can be circular, once the flip-flop on the far right is reached, the next flip-flop to its right is the flip-flop on the far left, and vice versa. This circular addressing (or wrapping around the end) is accomplished by injecting a pulse into the right-most flip-flop when shifting to the left when it is desired to address the right-most memory location, and injecting a pulse into the left-most flip-flop when shifting to the right when it is desired to address the left-most memory location. This is done by tying the left-most wQ_n+2_bar line to the right-most wQ_n−1_bar line, and injecting a pulse onto this common line when either of the above conditions is met (similar conditions apply to the read flip-flops as well).

Taking the flip-flop on the top-right of FIG. 16 for example: lines C and Cb are the clock signals for the flip-flop; line w_up_bar signals the flip-flop to get its next state from the flip-flop to its right (shift up); line w_down_bar signals the flip-flop to get its next state from the flip-flop to its left (shift down); line w hold bar signals the flip-flop to get its next state from its current state (do not shift, i.e., hold); line wQ_n−1_bar is the output from the flip-flop to the right in the chain (used for shifting up); line wQ_−n+2_bar is the output from the flip-flop to the left in the chain (used for shifting down); wQ_n_bar is the output to the next flip-flop to the right (used for shifting down); writebar signals that a write will be performed; and wQ_−n+1_bar is the output to the next flip=flop to the left (used for shifting up).

In this manner, the up, down, and hold functions described above are implemented and controlled in the addressing cell. Furthermore, the reset to initial state function is accomplished by deasserting the up, down, and hold lines. This clears all of the flip-flops. The addressing sequence is subsequently initiated by selecting either the up or down lines and injecting a pulse into the first or last flip-flop in the chain (the right most or left most of the 16 flip-flops for the present example).

The two flip-flops at the bottom of FIG. 16 and all of their associated logic and lines 52, 53 perform the same functions for the read addresses as does the write section. However, logic is added to be able to "kill" each of the read signals via the kill_rd0 and kill_rd1 lines, which accomplishes the desired feature of inhibiting all reads higher than the first cell when reading the first cell as described above.

The logic at the output of each of the read and write flip-flops simply provides the capability of turning the reads and writes off (via the writebar and kill_rd signals), and also guarantees that the reads and writes occur with the proper phase relationship to the clock signal such that reliable operation is obtained. The signals wr_n, wr_n+1, rd_n, and rd_n+1 are the actual signals (the word lines) which control the reading and writing operations of the shift registers (rams).

In the above discussion, it is to be understood that the term shifting up means changing the address from one location to the next higher location, shifting down means changing the address from one location to the next lower location, and hold means continue to address the same location. All of the control signals are generated via external logic.

It will be understood by those skilled in the art that the number of taps, decimation factor and number of stages which can be cascaded for the decimation circuitry according to the present invention are only constrained by the physical limitations of the device.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed:

1. A decimation circuit, comprising:
   a forward shifting data section receiving input data samples in order including a plurality of forward decimation registers coupled in series, each forward decimation registers having an input and an output, said forward decimation registers having a decimation depth and operating as FIFO registers;
   a reverse shifting data section including a plurality of reverse decimation registers coupled in series with each reverse decimation register having an input, output and a decimation depth, a first of said reverse decimation registers, which receives sequenced data samples in blocks from one of said forward decimation registers, operates as a paintbrush LIFO register to reverse sequence said data samples within the blocks, said blocks having a size corresponding to a decimation factor, wherein each of the other reverse decimation registers operate as FIFO registers; and
   a plurality of arithmetic logic units (ALUs) having two inputs and an output, each ALU having a first of said two inputs coupling with the output of one of said reverse decimation registers and a second of said two inputs coupling with the input of one of said forward decimation registers.

2. A decimation circuit according to claim 1, wherein said LIFO register is located at a beginning of said reverse shifting data section to fold the data samples at a block size equal to the decimation factor.

3. A decimation circuit according to claim 1, wherein said decimation depth is in a range of at least one to sixteen.

4. A decimation circuit according to claim 1, wherein said plurality of forward and reverse decimation registers are shift registers.

5. A decimation circuit according to claim 1, wherein the decimation circuit is cascadable with at least one other decimation circuit to form a longer decimation circuit.

6. A decimation circuit according to claim 1, wherein said outputs from said reverse decimation registers are A outputs and said inputs to said forward decimation registers are B, said plurality of ALUs being operable to provide A, B, A−B or B−A and A+B functions.

7. A decimation circuit according to claim 1 wherein said forward and reverse decimation registers are formed from memory locations in a random access memory (RAM) and further including:
   decimation control logic for operating said RAM memory to generate said LIFO and FIFO registers in accordance with read and write pointers to said memory.

8. A decimation circuit according to claim 7 wherein said two inputs of said ALUs connect to the same memory input or output in the RAM memory forming the forward and reverse decimation registers.

9. A decimation circuit according to claim 1, wherein said first reverse decimation register operating as the paintbrush LIFO register receives the sequenced data samples from the output of a last of said forward decimation registers during normal operation and from the output of an earlier forward decimation register for accelerating the data samples.

10. A decimation circuit according to claim 9, further comprising multiplexing means for selecting which output of sequenced data samples from the forward decimating registers is to be coupled with the input of the LIFO register.

11. A decimation circuit memory according to claim 10, further comprising:
an input register receiving input data samples provided to said forward shifting data section.

12. A dual decimation circuit configuration having first and second input data lines, comprising:
a first decimation section including:
a first forward shifting data section receiving input data samples in order from the first input data line including a plurality of forward decimation registers coupled in series, each forward decimation register having an input and an output, said forward decimation registers having a decimation depth and operating as FIFO registers;
a first reverse shifting data section including a plurality of reverse decimation registers coupled in series with each reverse decimation register having an input, output and a decimation depth, a first of said reverse decimation registers being operable as at least one of a paintbrush LIFO register and a FIFO register, wherein each of the other reverse decimation registers operate as FIFO registers;
a first plurality of arithmetic logic units (ALUs) having two inputs and an output, each first ALU having a first of said two inputs coupling with the output of one of said reverse decimation registers and a second of said two inputs coupling with the input of one of said forward decimation registers;
a second decimation section including:
a second forward shifting data section including a plurality of forward decimation registers coupled in series, each forward decimation register having an input and an output, said forward decimation registers having a decimation depth and operating as FIFO registers;
a second reverse shifting data section including a plurality of reverse decimation registers coupled in series with each reverse decimation register having an input, output and a decimation depth, a first of said reverse decimation registers, which receives sequenced data samples in blocks from one of said forward decimation registers in the second decimation section, operates as a paintbrush LIFO register to reverse sequence said data samples within the blocks, said blocks having a size corresponding to a decimation factor, wherein each of the other reverse decimation registers operate as FIFO registers;
a second plurality of ALUs having two inputs and an output, each second ALU having a first of said two inputs coupling with the output of one of said reverse decimation registers and a second of said two inputs coupling with the input of one of said forward decimation registers; and
means for multiplexing connections within and between said first and second decimation circuits to form various configurations of the dual decimation circuit.

13. A dual decimation circuit according to claim 12, wherein said means for multiplexing couples said second input data line to said second decimation section, said means for multiplexing further comprising:
a first multiplexing circuit operable to couple the output of one of said forward decimation registers to said LIFO register for each of said first and second decimation sections, respectively, wherein said first and second decimation sections operate independently.

14. A dual decimation circuit according to claim 13, wherein said means for multiplexing further comprises:
a second multiplexing circuit operable to couple a last forward decimation register of said first decimation section with a first forward decimation register of said second decimation section and a last reverse decimation register of said second decimation section with said first reverse decimation register of said first decimation section, wherein said first and second decimation sections are cascaded together with said first reverse decimation register of said first decimation section operating as a FIFO register to form a longer decimation circuit.

15. A dual decimation circuit according to claim 14, wherein said means for multiplexing further comprises:
a third multiplexing circuit operable to couple the first input data line to said second decimation section for operating said first and second decimation sections independently with the same data.

16. A dual decimation circuit according to claim 15, wherein said first, second and third multiplexing circuits are formed using tri-state inverters.

17. A decimation circuit according to claim 12, wherein said first reverse decimation register operating as the paintbrush LIFO register receives the sequenced data samples from the output of a last of said forward decimation registers during normal operation and from the output of an earlier forward decimation register for accelerating the data samples.

18. A decimating memory, comprising:
a memory having addressable memory locations, said memory forming a plurality of registers, each of said registers including at least one addressable memory location;
said plurality of registers form a forward shifting data section and a reverse shifting data section;
a first decoder operating said registers in the forward shifting data section and all but a first of said registers in the reverse shifting data section as FIFO registers via read and write addressing of said addressable memory locations to input and output data samples, said read and write addressing of said addressable memory locations being offset with respect to one another to provide a decimation factor;
a paintbrush decoder operating said first register in the reverse shifting data section as a LIFO register for reverse sequencing data samples within blocks of data samples received from said forward shifting data section, each of said registers in the forward shifting and reverse shifting data section providing an output; and
an ALU section operating on said outputs and providing a decimating memory output.

19. A decimating memory according to claim 18, further comprising:
an input register receiving input data samples provided to said forward shifting data section.

20. A decimating memory according to claim 19, further comprising:

an output register receiving outputs over output busses from said ALU section and providing the decimating memory output.

21. A decimating memory according to claim 20, wherein the decimating memory is formed of two or more levels of interconnect process.

22. A decimating memory according to claim 21, wherein said ALU section is formed under output busses from the ALU section to said output register whereby no additional space is required for the ALU section.

23. A decimating memory according to claim 18, wherein said outputs from said reverse decimation registers are A outputs and said outputs from said forward decimation registers are B outputs, said plurality of ALUs being operable to provide A, B, A−B or B−A and A+B functions.

24. A decimating memory according to claim 18, wherein said LIFO register includes the same number of address locations as said FIFO registers.

25. A decimating memory according to claim 24, wherein said paintbrush decoder operates said LIFO register as a $MOD_N$ length memory wherein N is the decimation factor.

26. A decimating memory according to claim 18, wherein said memory is a random access memory.

27. A decimating memory according to claim 26, wherein said random access memory is a dual port random access memory.

28. A decimating memory according to claim 18, wherein said ALU section always connects to the same memory input or output in said memory.

29. A decimating memory according to claim 18, wherein said first decoder drives said FIFO registers with the same address sequence and said paintbrush decoder drives said LIFO register with an address sequence different from said FIFO address sequence.

30. A decimation circuit according to claim 18, wherein said first reverse decimation register operating as the paintbrush LIFO register receives the sequenced data samples from the output of a last of said forward decimation registers during normal operation and from the output of an earlier forward decimation register for accelerating the data samples.

31. A method of operating decimation circuitry for a digital filter, the method comprising the steps of:
receiving data samples in forward shifting data section having a plurality of forward decimation registers coupled in-line;
operating said forward decimation registers as FIFO registers of a certain decimation depth;
providing an output from one of said forward decimation registers as an input to a first decimation register in a reverse shifting data section having a plurality of reverse decimation registers;
operating said first decimation register in the reverse shifting data section as a LIFO register and the other reverse decimation registers as FIFO registers;
reversing the order of data samples within blocks of data samples received in the first decimation register, said blocks having a size corresponding to the decimation depth;
passing in-line the reversed data samples within blocks from the first decimation register to said reverse FIFO registers;
providing a decimation output from each of the plurality of forward decimation registers and reverse decimation registers; and
operating on said decimation outputs to provide an ALU combination of forward and reverse sequenced data samples.

32. A method according to claim 31, wherein said decimation outputs include A outputs from the reverse decimation registers and B outputs from the forward decimation registers and wherein the step of operating on said decimation outputs further comprises the step of:
performing A, B, A−B or B−A and A+B functions with the ALU.

33. A method according to claim 31, wherein said step of operating the first reverse decimation register as a paintbrush LIFO register includes receiving the sequenced data samples from the output of a last of said forward decimation registers during normal operation and from the output of an earlier forward decimation register for accelerating the data samples.

* * * * *